United States Patent [19]

Young

[11] Patent Number: 4,581,548
[45] Date of Patent: Apr. 8, 1986

[54] ADDRESS DECODER

[75] Inventor: William R. Young, Palm Bay, Fla.

[73] Assignee: Harris Corporation, Melbourne, Fla.

[21] Appl. No.: 475,618

[22] Filed: Mar. 15, 1983

[51] Int. Cl.⁴ .......................................... H03K 19/096
[52] U.S. Cl. .................................... 307/449; 307/279; 307/463; 307/481
[58] Field of Search ............... 307/279, 449, 463, 480, 307/481; 365/203, 233

[56] References Cited

U.S. PATENT DOCUMENTS

| | | | |
|---|---|---|---|
| 4,086,500 | 4/1978 | Suzuki et al. | 307/270 |
| 4,216,389 | 8/1980 | Carter | 307/247 R |
| 4,275,312 | 6/1981 | Saitou et al. | |
| 4,281,399 | 7/1981 | Yamamoto | |
| 4,289,982 | 9/1981 | Smith | 307/463 |
| 4,305,139 | 12/1981 | Zbrozek | |

Primary Examiner—S. D. Miller
Assistant Examiner—D. R. Hudspeth
Attorney, Agent, or Firm—Barnes & Thornburg

[57] ABSTRACT

An address decoder architecture capable of having a precharge signal for the word line coincident with the enabling of the decoder section to reduce the operating cycle. The word line latch is separate and distinct from the word line driver such that disablement of the word line driver during readdressing of the enabled decoder will not effect the portion of the cycle that the word line maintains its logic state.

26 Claims, 5 Drawing Figures

ADDRESS DECODER

BACKGROUND OF THE INVENTION

The present invention relates generally to decoders and more specifically to an improved word line driver and latch for a decoder.

A word line decoder, as illustrated in FIG. 1 generally includes a decoding section 12, a line driver section 14 and a latch 16.

The decoder portion 12 includes a plurality of decoder transistors P1 through P7 having their source and drain paths connected in parallel and each one uniquely receiving word address AW on their gates. The sources of the decoder devices P1 through P7 are connected to a voltage supply VCC by a transistor P8 whose gate is controlled by a decoder enable signal $\overline{DE}$. The drains of the address decoders P1 through P7 are connected to the drain of precharge transistor N1 whose source is ground and whose gate is controlled by the decoder enable signal $\overline{DE}$. The line driver 14 is a CMOS inverter including P9 and N2 wherein the source of P9 is connected to the word signal WDS. A precharge transistor N3, whose source is grounded and whose gate receives the decoder enable signal $\overline{DE}$, precharges the word line WL low. The latch 16 includes transistor N4 having its drain connected to the input of the inverter P9-N2, its source connected to ground and its gate connected to the word line WL.

In a normal operation cycle of the decoder of FIG. 1, the decoder enable signal $\overline{DE}$ is high turning off P8 and turning on N1 and N3. This disconnects the supply voltage VCC from the decoder portion 12, removes any charge or current on the drains of the decoder transistors P1–P7, and precharges the word line WL low, respectively. This generally occurs from T0 through T25. Also during this first period, the addresses lines AW applied to the gates of P1 through P7 can be changed as illustrated by the transition in FIG. 2. The next portion of this cycle is when the decoder enable signal $\overline{DE}$ goes low turning on P8 and turning off N1 and N3. This enables the decoder section 12. The decoder enable $\overline{DE}$ stays low for the remainder of the cycle from T25 to T200. If the unique address of the decoder section 12 is received, the word line driver 14 provides the word signal WDS as a word line signal along word line WL. The word signal WDS is delayed from T25 to T75 to allow sufficient time for the address decoder transistors P1 through P7 to pull the gate of the word line drive P9 high which disables all non decoded word line drivers. The latch 16 operates in response to a word line high signal to latch the input of the word line driver 14. The timing graphs are illustrated in FIG. 2.

It can be seen that the cycle generally includes a precharge or deaccess cycle during which the address is changed followed by an access or enable or line drive cycle. The precharge and address change cycles are inter-related and cannot be performed independently, since the word line drive is an integral part of the latch. Thus, the period needed to perform the cycles is longer than desired. Thus, there exists the need for a new address decoder architecture which will allow for a decrease in the total cycle of the address decoder.

SUMMARY OF THE INVENTION

An object of the present invention is to provide a new architecture for an address decoder which reduces the operating cycle.

Another object of the present invention is to provide a precharge configuration which increases the probability of total precharge on the word line without increasing the precharge cycle.

Still another object of the present invention is to provide a line driver and latch portions of an address decoder which have quicker response times.

An even further object of to present invention is the reduce the delay between the end of the precharge cycle and the activation of the word line drive caused by a change of address and reactivation of the decoder during precharge.

These and other objects of the present invention are obtained by separating the decoder enable signal and the precharge signal such that the decoder may be enabled prior, during and subsequent to precharging thereby reducing the lag time needed for the decoder to be settled with a new address while the word line maintains the previous state held by a latch. The latch is also separated from a line driver so that the line driver can be disabled during the address change thereby isolating the new address from the word line prior to and during precharge. The precharge circuitry includes a pair of precharge devices one at each end of the word line to decrease the time required to fully charge high impedance word lines. The line driver is an inverter including a pair of enable transistors to isolate the line from leakage current of the inverter and the decoder. The latch is a full latch which is responsive to high and low signals on the line to maintain the high and low signals and includes a pair of inverters with the input of the first inverter being the line, the input of the second inverter being the output of the first inverter and the output of the second inverter being the word line. The second inverter includes a pair of enable transistors to isolate the word line from the voltage sources during precharge and when the line is being driven by the line driver.

Other objects, advantages, and novel features of the present invention will become apparent from the following detailed description of the invention when considered in conjunction with the accompanying drawings.

DESCRIPTION OF THE PREFERRED EMBODIMENTS

Figure 1:
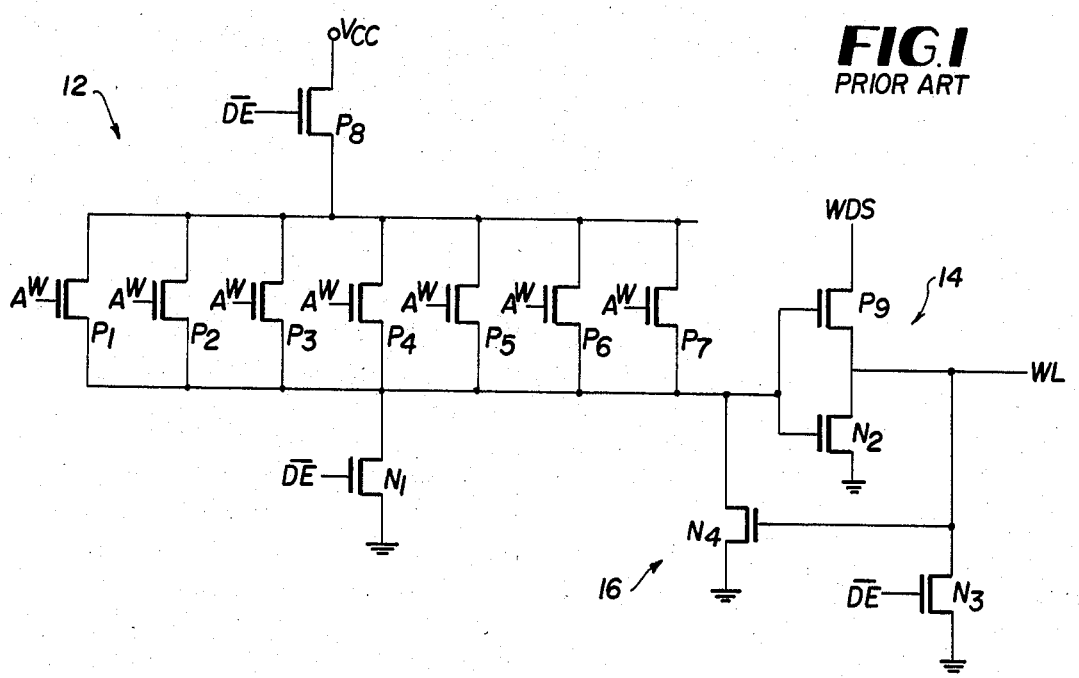
FIG. 1 is a schematic diagram of an address decoder of the prior art.
Figure 3:
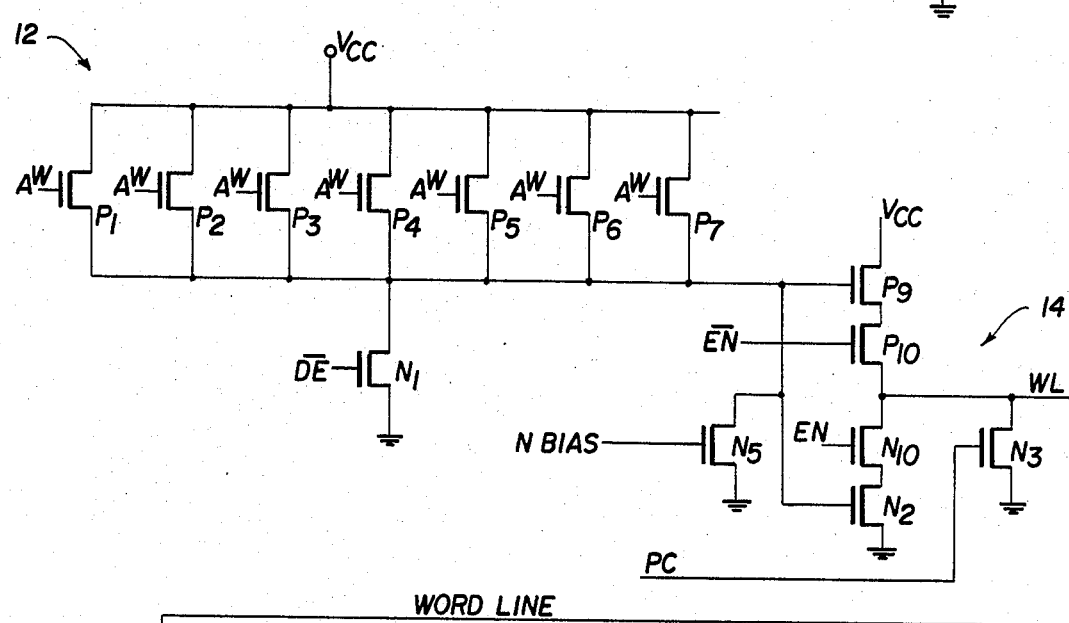
FIG. 3 is a schematic of an address decoder incorporating the principles of the present invention.
Figure 3:
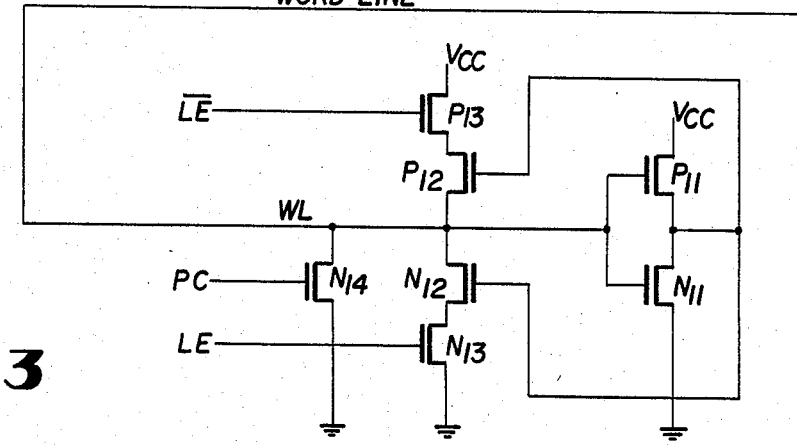
Figure 2:
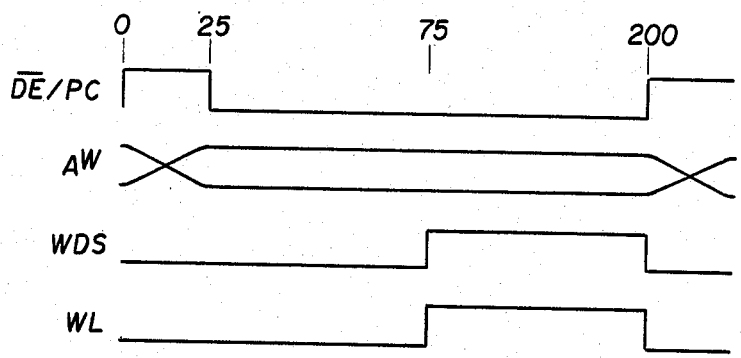
FIG. 2 are graphs of the signals of the prior art schematic of FIG. 1.

An address decoder is illustrated in FIG. 3 as including a decoding section 12, a line driver section 14 and a latch section 16. The decoding section 12 is the same as illustrated in FIG. 1 of the prior art except that P8 has been removed. It includes a plurality of parallel connected decoding transistors P1–P7 having a unique address applied to their gates, their drains connected to a supply voltage VCC and their sources connected to ground by transistor N1. The gates of transistor N1 is controlled by the decoder enable signal $\overline{DE}$. As will be explained in detail below, the transistor P8 can be removed since the address is not changed during the precharge cycle. The line driver section 14 includes a CMOS inverter including transistors P9 and N2 as in the prior art of FIG. 1 with the addition of an enable switches N10 and P10 having their source and drain connected between the drain of transistors N2 and P9, respectively, and the word line WL. The gate of enable transistors N10 and P10 receives the enable signals EN and $\overline{EN}$, respectively. A current sink transistor N5 connects the input of the word line driver 14 to ground and is continuously biased on by N BIAS signal provided at its gate. The current sink transistor N5 removes any charge or leakage current which may be on the input to the word line driver 14 due to the transistors of the decoder section 12. Although this charge has been dissipated during the decoder disable signal by transistor N1, the current sink transistor N5 provides continuous sinking during the remainder portion of the cycles.

The precharged transistor N3 is connected to the word line WL at the output of the word line driver 14 and is responsive to a precharge signal PC on its gate. At the other end of the line, a precharge transistor N14 also has the percharge signal PC connected to its gate and in combination with N3 provide a precharge of the word line low from both ends of the line. The precharge signal PC is separate and distinct from the decoder enable signal $\overline{DE}$ and consequently different timing cycles may be provided as will be explained with reference to FIG. 4.

The latch 16 includes a first CMOS inverter having transistors P11 and N11 whose input is connected to the word line WL and a second CMOS inverter including transistors P12 and N12 whose inputs are connected to the output of the first inverter and whose output is connected to the word line WL. A current sourcing transistor P13 has its source-drain path connected between the supply voltage VCC and the source of transistor P12 and has its gate controlled by a latch enable signal $\overline{LE}$. Similarly, a current sinking device, illustrated by transistor N13, has its source-drain path connected between ground and the source of transistor N12 and latch enable signal LE connected to its gate. The current sourcing transistor P13 is maintained off at least during the precharge portion of the cycle, thereby preventing P13 from conflicting with precharge transistors N3 and N14 during precharge. The current sinking transistor N13 is maintained off at least during the portion of the cycle that the word line driver 14 is driving the word line, thereby preventing N13 from conflicting with line driver transistors P9 and P10 driving the word line high. The transistors P12, P13, N12 and N13 provide a low impedance path to maintain the state of the word line when the word line drive 14 is disabled. The sourcing and sinking transistors P13 and N13 provide a continuous source and sink for the leakage current and thereby reducing the delay at the inputs of the latch. The latch 16 is a full latch compared to the single sided latch N4 of the prior art of FIG. 1.

Figure 4:
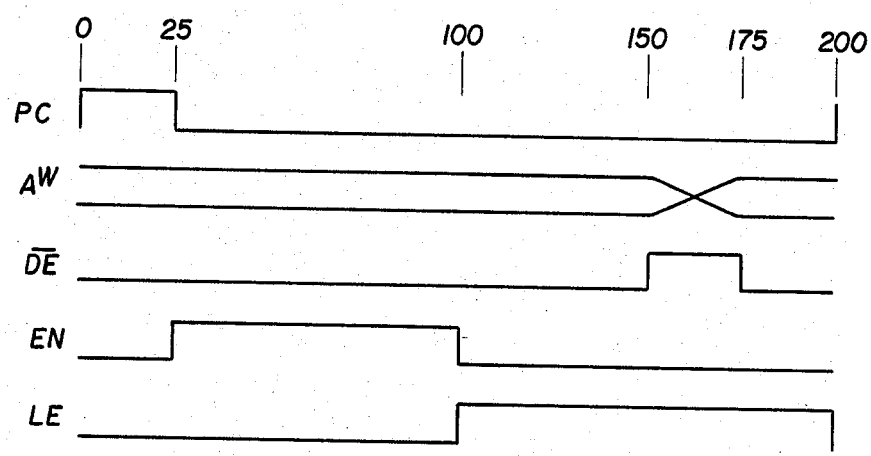
FIG. 4 are graphs of the signals for the schematic of FIG. 3.

The cycle of the operation of the present decoder will now be described with reference to the graphs of FIG. 4. In the first portion of the cycle T0–T25, the precharge signal PC is high turning on precharge transistors N3 and N14 to precharge both ends of the word line low. The line driver enable signal EN is low maintaining the enable transistors N10 and P10 off and disconnecting the transistors N2 and P9 of the line driver 14 from the word line WL. Prior to and during this initial period T0–T25, the decoder enable signal $\overline{DE}$ is low enabling the decoder, by turning off N1, to decode the new address signals AW provided to the decoder. This allows the decoder to be activated and to decode the addresses while the word line is being precharged to a low signal.

Upon the expiration of the precharge cycle, the word line driver 14 is enabled by a high enable signal EN to transistors N10 and P10 turning them on and allowing the word line driver 14 to receive the output of the decoder section 12 and drive the word line WL. The word line driver 14 and the decoder 12 are maintained activated for the second period T25–T100. At time T100, the line driver enable signal EN goes low again turning off transistors N10 and P10 and disabling the word line driver 14, and the latch enable signal LE goes high turning on latch transistors P13 and N13 which were off during the T0 to T100. This effectively disconnects the decoder 12 and the word line driver 14 from the word line and allows the word line to be maintained in its address state by latch 16. This condition is maintained from T100 to T200 which is the end of the cycle.

Since the word line is effectively isolated from the decoder 12 by the disabled word line driver 14, a new address may be provided on the address line AW before the end of the cycle. For example, from T150 to T175, the decoder enable signals $\overline{DE}$ goes high turning on N1 to remove charge or current on the drains of the decoder transisters P1–P7 and allowing a new address AW to be provided to their gates. Before the beginning of a new cycle, namely T175 to T200, the decoder enables signal $\overline{DE}$ goes low turning N1 off. This allows the decoder to decode the new address and settle before the precharge portion of the cycle and provide a signal to transistors P9 and N2 of the word line driver during the precharge portion of the cycle. Since the new address is provided between, T100 and T200, when the old address is being held by the latch 16, transistor N10 of the word line drive 14 is off thereby preventing the new address from turning on N2 of the word line drive.

Figure 5:
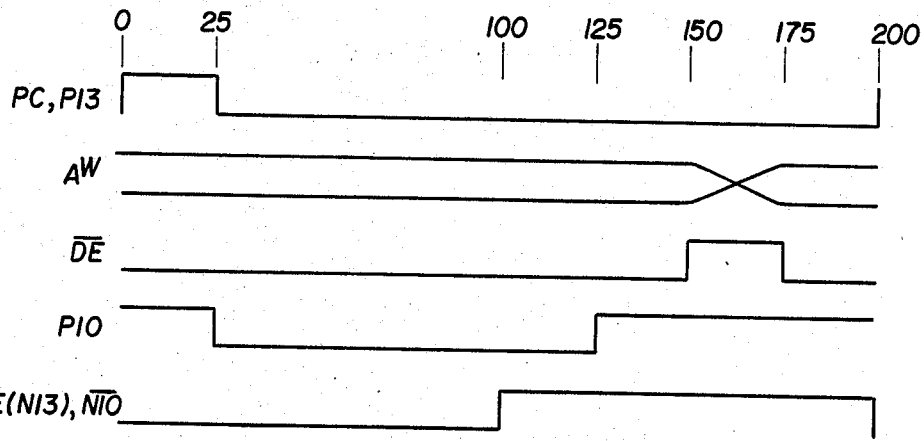
FIG. 5 are graphs of alternative signals for the schematic of FIG. 3.

An alternative cycle for driving high impedance word lines, for example polysilicon, is illustrated in the graphic of FIG. 5. The precharge is still performed from T0 to T25, and the address transistion and decoder disable is still performed at T150 to T175. Since latch transistor P13 of the latch must be off only during precharge, it is controlled by the precharge signal PC. The line driver transistor N10 must be off during the latch cycle and does not have to be off during precharge, thus it can be controlled by the inverse of the latch enable signal LE. For high impedance lines, the line driver transistors P9 and P10 must continue to pull the word line high into the initial portion of the latch cycle. Thus line driver transistor P10 is maintained on from after precharge T25 into the latch portion of the cycle T125 and is off during the remainder of the latch portion of the cycle T125 through precharge T25.

The improved address decoder on FIG. 3 provides a full latch including inverter P11 and N11 and gated inverter P12, N12, P13 and N13 so as to maintain the word line at the desired level while the word line driver 14 is disabled. In the prior art device of FIG. 1, the latch transistor N4 is responsive to the word line value to latch the word line driver 14 into the desired state. Since word line driver 14 is part of the latching circuit in the prior art, it cannot be disabled to maintain the word line in the desired state. A new address cannot be provided to the decoder section 12 since it continuously provides an input to the word line driver 14 which now must operate as a latch. The present invention overcomes this problem by providing a latch separate and distinct from the word line driver which is disabled to isolate the word line from the decoder and thereby allowing the decoder section 12 to operate independent of the word line latch. Similarly, by using separate signals for the precharge stage and the decoder enable stage, the portions of the cycle may overlap and thus the total cycle is condensed.

From the preceding description of the preferred embodiment, it is evident that the objects of the present invention are attained, and although the invention has been described and illustrated in detail, it is to be clearly understood that the same is by way of illustration and example only and is not to be taken by way of limitation. The spirit and scope of this invention are to be limited only by the terms of the appended claims.

What is claimed is:

1. An address decoder comprising:
   decoder means for decoding address signals and providing a decoded signal in response to a decoder enable signal;
   line driver means for driving a line in response to said decoded signal and driver enable signal and for isolating said line from said line decoder means during a latch period in response to a lack of a driver enable signal which disables said line driver means;
   latch means for latching said line to the value established on the line by said line driver means in response to a latch enable signal during said latch period;
   precharge means for precharging said line in response to a precharge signal distinct from said decoder enable signal during a precharge period; and
   signal means for generating said decoder enable signal, said driver enable signal, said latch enable signal and said precharge signal.

2. An address decoder according to claim 1, wherein said signal means generates said precharge signal as a logic high during a period when said decoder enable signal is a logic high.

3. An address decoder according to claim 2, wherein said signal means generates said driver enable signal as a logic low and said latch enable signal as a logic low during said precharge period.

4. An address decoder according to claim 2, wherein said signal means generates said decoder enable signal as a logic low during said latch period.

5. An address decoder according to claim 1 wherein said signal means generates said driver enable signal as a logic low and said latch enable signal as a logic low during said precharge period.

6. An address decoder according to claim 5 wherein said signal means generates said decoder enable signal as a logic low during a portion of said latch period and as a logic high preceeding, during and subsequent to said precharge period.

7. An address decoder according to claim 1, wherein said signal means generates said decoder enable signal as a logic low during said latch period.

8. An address decoder according to claim 1 wherein said signal means generates said driver enable signal a delay period after generating said latch enable signal.

9. An address decoder according to claim 1 wherein said line has first and second ends and said precharge means include a pair of precharge means one coupled to each end of said line for precharging said line in response to said precharge signal.

10. An address decoder according to claim 9, wherein said line driver means is coupled to said first end of said line and said latch means is coupled to said second end of said line.

11. An address decoder according to claim 1, wherein said latch means include a first inverter means having an input connected to said line and an output and a second gated inverter means having an input connected to the output of said first inverter means, an output connected to said line, and a gate for receiving said latch enable signal; and wherein said line driver means includes a third gated inverter means having an input connected to said decoder means, an output connected to said line, and a gate for receiving said driver enable signal.

12. An address decoder comprising:
    decoder means having an address input and an enable input for generating a line select signal in response to an address signal and a decoder enable signal;
    line driver means having a line select input and an enable input for generating a line drive signal on a line in response to said line select signal and a driver enable signal distinct from said decoder enable signal;
    precharge means for precharging said line in response to a precharge signal distinct from said decoder enable signal;
    latch means connected to said line for latching said line with said line drive signal; and
    signal means for generating said decoder enable signal, said driver enable signal and said precharge signal.

13. An address decoder according to claim 12, wherein said line has first and second ends and said precharge means includes a pair of precharge means, one connected to each end of said line.

14. An address decoder according to claim 13, wherein said line driver means and said latch means are connected to said first and second ends of said line respectively.

15. An address decoder according to claim 13, wherein said line driver means includes a complementary field effect transistor inverter whose input is said line select signal and whose output is said line drive signal, and enable P channel device in series with a P channel device of said CFET inverter with its gate receiving the inverse of said driver enable signal and an enable N channel device in series with an N channel device of said CFET inverter with its gate receiving the inverse of said latch enable signal.

16. An address decoder according to claim 15, wherein said enable N and P channel devices are between said CFET inverter's N and P channel devices respectively and said output of said CFET inverter.

17. An address decoder according to claim 13 wherein said latch means is responsive to a latch enable signal for latching said line with said line drive signal; and said signal means generates said latch enable signal.

18. An address decoder according to claim 17, wherein said line driver means includes a complementary field effect transistor inverter whose input is said line select signal and whose output is said line drive signal, an enable P channel device in series with a P channel device of said inverter with its gate receiveing said driver enable signal and an enable N channel device in series with an N channel device of said inverter with its gate receiving the inverse of said latch enable signal.

19. An address decoder according to claim 17, wherein said latch means includes a first complementary field effect transistor inverter whose input is connected to said line and a second CFET inverter whose input is connected to the output of said first CFET inverter and whose output is connected to said line; said second CFET inverter includes an enable P channel device in series with a P channel device of said second CFET inverter with its gate receiving the inverse of said latch enable signal and an enable N channel device in series with an N channel device of said second CFET inverter with its gate receiving said latch enable signal.

20. An address decoder according to claim 17, wherein said latch means includes a first complementary field effect transistor inverter whose input is connected to said line and a second CFET inverter whose input is connected to the output of said first CFET inverter and whose output is connected to said line; said second CFET inverter includes an enable P channel device in series with a P channel device of said second CFET inverter with its gate receiving said precharge signal and an enable N channel device in series with an N channel device of said second CFET inverter with its gate receiving said latch enable signal.

21. An address decoder according to claim 17 wherein said signal means generates a logic low driver and latch enable signal during the period of a logic high precharge signal.

22. An address decoder according to claim 21 wherein said signal means generates a logic low driver enable signal during the period of a logic high latch enable signal.

23. An address decoder according to claim 21 wherein said signal means generates a logic low decoder enable signal during the period of a simultaneous logic low driver enable signal and logic high latch enable signal.

24. An address decoder according to claim 12 wherein said signal means generates a logic high precharge signal during the period of a logic high decoder enable signal.

25. An address decoder according to claim 24 wherein said signal means generates a logic low drive enable signal for the duration of a logic low decoder enable signal.

26. An address decoder according to claim 25 wherein said signal means also generates a logic low driver enable signal for the duration of a logic high precharge signal.

* * * * *